United States Patent
Terakado et al.

(10) Patent No.: US 7,893,607 B2
(45) Date of Patent: Feb. 22, 2011

(54) ORGANIC ELECTROLUMINESCENCE DISPLAY DEVICE

(75) Inventors: Masatomo Terakado, Chiba (JP);
Shinichi Kato, Mobara (JP); Eiji Matsuzaki, Yokohama (JP)

(73) Assignee: Hitachi Displays., Ltd., Chiba (JP)

( * ) Notice: Subject to any disclaimer, the term of this patent is extended or adjusted under 35 U.S.C. 154(b) by 601 days.

(21) Appl. No.: 11/178,421

(22) Filed: Jul. 12, 2005

(65) Prior Publication Data
US 2006/0012288 A1 Jan. 19, 2006

(30) Foreign Application Priority Data
Jul. 13, 2004 (JP) ............... 2004-206105

(51) Int. Cl.
*H01J 1/62* (2006.01)
*H01J 63/04* (2006.01)

(52) U.S. Cl. ............... 313/503; 313/483; 313/498; 313/500; 313/501; 313/504; 313/505; 313/506

(58) Field of Classification Search ........... None
See application file for complete search history.

(56) References Cited

U.S. PATENT DOCUMENTS

| | | | |
|---|---|---|---|
| 5,932,327 A * | 8/1999 | Inoguchi et al. ............ 428/212 |
| 6,140,766 A * | 10/2000 | Okada et al. ............... 313/506 |
| 6,624,567 B2 * | 9/2003 | Nagayama et al. ......... 313/503 |
| 2002/0093284 A1 * | 7/2002 | Adachi et al. .............. 313/506 |
| 2003/0107314 A1 * | 6/2003 | Urabe et al. ............... 313/506 |
| 2004/0000864 A1 | 1/2004 | Kato |
| 2005/0146266 A1 | 7/2005 | Kuma et al. |

* cited by examiner

*Primary Examiner*—Nimeshkumar D Patel
*Assistant Examiner*—Natalie K Walford
(74) *Attorney, Agent, or Firm*—Antonelli, Terry, Stout & Kraus, LLP.

(57) ABSTRACT

On a main face of a substrate, organic EL light emitting layers are formed by stacking first electrodes for respective pixels, an organic EL layer having a white light emitting function formed above the first electrodes to cover the first electrodes in common, and a second electrode formed such that the second electrode covers the organic EL layer in common in this order, and light emitted from the organic EL layer is irradiated to the second electrode side. Above the second electrode, a color converting filter, which converts the white light emitted from the organic EL light emitting layer to a given color and is applied by coating using a wet process, is formed for every pixel, and a protective layer, which prevents the deterioration of the light emitting layer attributed to a coating material of the color filter, is provided between the second electrode and the color converting filter.

16 Claims, 4 Drawing Sheets

ORGANIC ELECTROLUMINESCENCE DISPLAY DEVICE

CROSS-REFERENCES TO RELATED APPLICATIONS

The disclosure of Japanese Patent Application JP2004-195217, filed on Jul. 13, 2004, including the specification, drawings and abstract thereof, is incorporated herein by reference in its entirety.

BACKGROUND OF THE INVENTION

The present invention relates in general to a display device, and, more particularly, the present invention relates to an organic electroluminescence display device (hereinafter referred to as "organic EL display device") which is capable of producing a multi-colored display by combining organic EL elements, which are capable of emitting a white light, and color filters.

Recently, along with the advent of an advanced information-oriented society, the demand for personal computers, car navigation systems, personal digital assistants, information communication equipment and composite products of such equipment has been increasing. As a display device for use in these products, a display device which has a reduced thickness, is light-weight and exhibits a low power consumption is suitable. From this viewpoint, a liquid crystal display device which uses auxiliary illumination, a display device which uses self-luminous electro-optical elements, such as organic EL elements, and a plasma display device have been practically used.

In this type of display device, to realize a color display, unit pixels of a plurality of colors (usually, three colors consisting of red(R), green(G) and blue(B)) are arranged close to each other and, a color layer (a color filter or a color emitting layer) is formed for every pixel unit, thus realizing a so-called full color display.

In a process for manufacture of an organic EL display device that is capable of producing a full color display, the coatings in three-colors, which are produced by a mask vapor deposition method, are formed separately for forming an organic EL layer. When a large-sized board that is capable of producing a large number of substrates at a time is used for enhancing the throughput and for reducing the manufacturing cost, there exists a limit with respect to the manufacturing accuracy of a mask and the positioning accuracy that can be attained in the mask vapor deposition method. Further, since the mask is liable to easily suffer from a change in the size thereof due to the heat radiation from a vapor deposition source, it is difficult to achieve a high yield ratio. Still further, the operational efficiency of a manufacturing facility is lowered, since a step to treat foreign substances in the vapor deposition atmosphere and the exchange of masks require a considerable time.

To cope with such drawbacks, various techniques have been known. Japanese Patent. Laid-open 2004-47387 (Patent literatures 1) and Japanese Patent Laid-open 2004-55355 (Patent literatures 2) disclose an organic EL display device having a top emission structure in which a first substrate, having an organic EL element formed thereon, and a second substrate, having a color changing medium formed thereon by a photolithography method, are laminated to each other with a given gap therebetween.

Japanese Patent 3395841 (Patent literature 3) discloses a method of manufacture of liquid-crystal-panel filters in which wettability varying layers are formed on a smooth transparent substrate and respective color filter dyes are selectively applied to the wettability varying layers by making use of the difference in wettability.

Japanese Patent Laid-open Hei7(1995)-220871 (Patent literature 4) discloses an organic EL display device which produces a full color display by combining color filters with a white organic EL element.

Japanese Patent Laid-open Hei10(1998)-255983 (Patent literature 5) discloses a display element which enables the emission of light of three primary colors with high efficiency by combining light emitting members, pigment converting members and color filters.

Besides the above-referenced literatures, Japanese Patent Laid-open 2003-282250 (Patent literature 6), Japanese Patent Laid-open 2003-187959 (Patent literature 7), Japanese Patent Laid-open Hei11(1999)-106934 (Patent literature 8), Japanese Patent Laid-open Hei11(1999)-242916 (Patent literature 9), Japanese Patent Laid-open Hei7(1995)-199165 (Patent literature 10), Japanese Patent Laid-open 2000-3786 (Patent literature 11) and Japanese Patent Laid-open 2004-22541 (Patent literature 12) disclose related subject matter.

SUMMARY OF THE INVENTION

However, in the technology disclosed in the patent literature 1 and the patent literature 2, a displacement is liable to easily occur in the alignment of both substrates, that is, between the light-emitting-portion-side substrate and the color-filter-side substrate, and, hence, it is difficult for the display device to achieve a high definition. Further, the color filters are basically formed by a photolithography method, and, hence, the manufacturing cost is increased. In the technology disclosed in the patent literature 3, due to the provision of the wettability varying layers, the numbers of materials and processes are increased, and it is difficult for the display device to avoid a high manufacturing cost. In the technology disclosed in the patent literature 4 and the patent literature 5, in the same manner as the subject matter disclosed in the patent literature 3, the numbers of materials and processes are increased, and it is difficult for the display device to avoid a high manufacturing cost. The patent literature 6 to the patent literature 10 disclose a technique for forming thin films at a relatively low temperature. The patent literature 11 and the patent literature 12 disclose a technique for forming color filters and color changing media in a top-emission-type organic EL display device. However, these patent literatures fail to disclose a technique which may be used to manufacture color filters and color changing media for a full color display with high definition at a low cost.

Accordingly, it is an object of the present invention to provide an organic EL display device which makes it possible to manufacture color filters and color changing media for a color display of high definition at a low cost.

The present invention includes a plurality of aspects to achieve the above-mentioned object.

The first aspect of the present invention, which achieves the above-mentioned object, is directed to an organic EL display device which includes organic EL elements which are formed by laminating first electrodes formed as a film for respective pixels, the organic EL layer having a white light emitting function which is formed on the respective first electrodes to cover the respective first electrodes in common, and a second electrode which is formed on the organic EL layer to cover the organic EL layer in common in this order on a main face of a substrate, wherein the organic EL display device further includes color changing media which have a function of converting a white light from the organic EL layers to light of a given color, which are constituted as upper layers and which are applied by coating using a wet process or color filters which have a light transmission peak at a given wavelength and are applied by a wet process above the second electrodes, and a protective layer which suppresses the deterioration of the light emitting layers attributed to a coating material used in the manufacturing step of the color changing media or the color filters are formed between the second electrodes and the color changing media or between the second electrodes and the color filters.

According to the first aspect of the invention, prior to the manufacture of the color changing media or the color filters using a wet process, the protective layer which exhibits a higher resistance against the coating material of the color changing media or the color filters formed above the second electrode than the light emitting layers, is formed. Accordingly, it is possible to suppress the deterioration of the light emitting layers which is generated in the coating step; and, at the same time, even when a residual component of a solvent used in the coating step remains in a finished product after the formation of the color filters, it is possible to protect the light emitting layers, and, hence, the light emitting property of the organic EL display device can be enhanced at a low cost. Here, the color filters may be divided for respective organic EL light emitting elements (in other words, for the respective pixels), and each one of the plurality of color filters may be arranged to face one of the plurality of first electrodes by way of the organic EL layer and the second electrode.

The second aspect of the present invention, which achieves the above-mentioned object, is directed to an organic EL display device in which by laminating a plurality of first electrodes (the respective electrodes corresponding to pixels on a display screen), an organic EL layer having a white light emitting function which is formed on the respective first electrodes to cover the respective first electrode in common (the organic EL layer being capable of including other organic material layer which assists the light emitting function of the organic EL layer) and a second electrode which is formed on the organic EL layer and covers the plurality of first electrodes in common (for example, the second electrode spreading over a whole display screen) in this order on a main face of a substrate, respective organic EL light emitting elements each of which is formed at a portion where one of the plurality of first electrodes, the organic EL layer and the second electrode are overlapped relative to each other are constituted (for example, two-dimensionally) in the inside of the main face of the substrate, and light emitted from the organic EL layer is irradiated to the second electrode side, wherein a leveling layer which levels a surface of the second electrode is provided above the second electrode for every organic EL light emitting element (in other words, for every pixel), and color filters are provided on or above the leveling layer.

According to the second aspect of the invention, the flatness of the organic EL light emitting layer can be made uniform among the pixels and, at the same time, the leaking of light from the neighboring pixels can be prevented by suitably selecting a refractive index of the leveling film and the size of the opening portion of the pixel formed by a black matrix BM, whereby an image display of high contrast and high color purity can be obtained.

The color filters may be arranged such that the plurality of color filters which correspond to the plurality of respective organic EL light emitting elements which are arranged in the inside of the main face of the substrate are arranged above the organic EL light emitting elements which correspond to the color filters (on a side opposite to the main face of the substrate by way of the organic EL light emitting elements). Each one of the plurality of color filters is arranged to face one of the plurality of first electrodes by way of the organic EL layer, the second electrode and the leveling layer.

Further, the third aspect of the present invention is directed to an organic EL display device in which a wavelength converting filter, which has a function of converting a wavelength of the light emitted from the organic EL layer and is formed by coating in a wet process, is formed above the second electrode for every organic EL element (in other words, for every pixel), a color filter is formed above each of the wavelength converting filters, a first protective layer for suppressing the deterioration of the organic EL layer attributed to a coating material of the wavelength converting filter (for example, a material which is used in a wet process for forming the wavelength converting filter) is formed between the second electrode and the wavelength converting filter, and a second protective layer for preventing the deterioration of the organic EL layer attributed to a coating material of the color filter (for example, a material which is used in a wet process for forming the color filter) is formed between the wavelength converting filter and the color filter.

Here, the wavelength converting filter is also referred to as a color changing medium and is provided for changing the wavelength profile (the distribution of intensity for the wavelength) of light incident on the wavelength converting filter based on the activation and deactivation of the electron energy level in the material. Accordingly, the color filter and the wavelength converting filter differ from each other with respect to the fact that, while the color filter selectively irradiates the light which is incident on the color filter within a given wavelength band, the wavelength converting filter irradiates the light incident on the wavelength converting filter by changing a wavelength profile thereof (by shifting a wavelength which exhibits the maximum intensity).

Here, it is preferable that the wavelength converting filter is divided into a plural number corresponding to the plurality of respective organic EL elements arranged in the inside of the main face, and each one of the respective wavelength converting filters may be arranged on an upper portion (a side opposite to the main face of the substrate by way of the organic EL element) corresponding to the wavelength converting filter. Each one of the respective wavelength converting filters is arranged to face each one of the plurality of first electrodes by way of the organic EL layer, the second electrode and the first protective layer. On the other hand, it is preferable that the color filter is divided in a plural number corresponding to the plurality of respective wavelength converting filters, and each color filter is arranged to face a corresponding one of the plurality of wavelength converting filters by way of the second protective layer.

Here, it is needless to say that the present invention is not limited to the above-mentioned examples and the constitutions of embodiments to be described later, and that various modifications can be made without departing from the technical concept of the present invention.

According to the present invention, it is possible to apply the color filters and the color changing media (the wavelength converting filters) for performing a full color display of high definition with high positional accuracy and at a low cost, whereby it is possible to provide an organic EL display device which can produce an image display of high quality.

DETAILED DESCRIPTION OF THE INVENTION

Hereinafter, various embodiments of the present invention will be explained in conjunction with the accompanying drawings.

Embodiment 1

Figure 1:
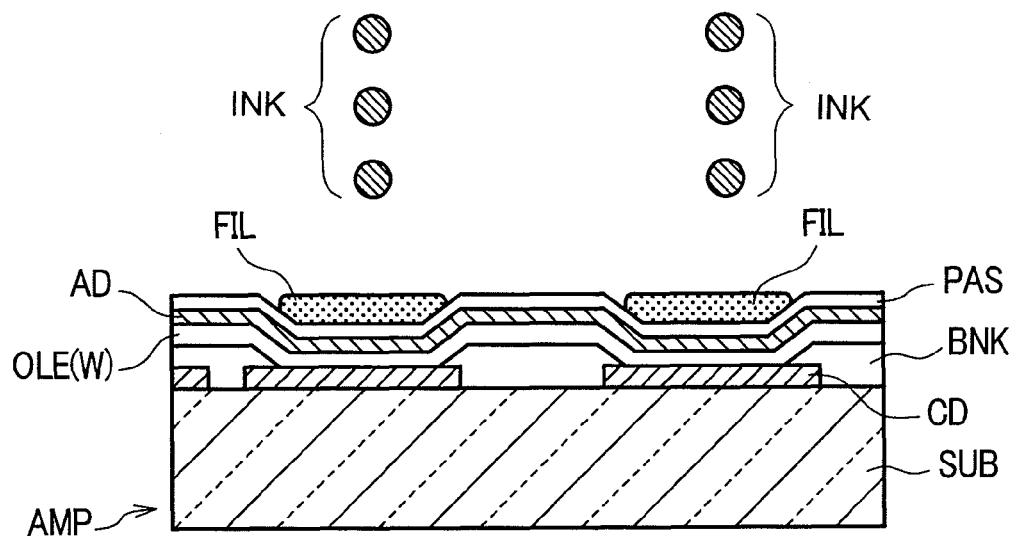
FIG. 1 is a cross-sectional view showing an embodiment 1 of the present invention.

FIG. 1 is a cross-sectional view showing an embodiment 1 of the present invention. A substrate AMP in FIG. 1 is an active matrix substrate (or a thin film transistor substrate or a TFT substrate in an abbreviated form) which constitutes an organic EL display device. On the TFT substrate AMP, a cathode CD, which constitutes a first electrode, is formed for every pixel on a main face of an insulating substrate (here, a glass substrate) SUB. The cathode CD is formed by the patterning of a conductive metal film. As the conductive metal film, an alloy of aluminum and lithium fluoride (LiF) is used. On the other hand, besides the alloy of aluminum and lithium fluoride (LiF), a Mg/Al alloy, Mg/in alloy and the like can be used. Such a conductive metal film is formed on a main face of the glass substrate SUB by vapor deposition, sputtering, CVD or the like, and a desired patterning is performed through a photolithography step or the like, thus forming a cathode CD for every pixel. It is preferable that the cathode CD has a favorable reflectance.

Next, an insulation film (hereinafter referred to as "an interlayer film") which covers the cathodes CD is formed. The interlayer film may be formed of an inorganic material, such as silicon nitride (SiN), on the main face of the substrate SUB, including the cathodes CD, using a chemical vapor deposition method. Further, the interlayer film may be formed by applying an organic material, such as Novorak resin or the like, to the main face of the substrate SUB by coating and curing the Novorak resin thereafter. The interlayer film is subjected to patterning such that upper surfaces of the cathodes CD are exposed, thus forming partition banks (also referred to as "banks") BNK. A region which includes an upper surface of the cathode CD, which is surrounded by the banks BNK, corresponds to one pixel (a sub pixel for color display).

An organic EL light emitting layer (also referred to as "an organic EL layer") OLE is formed above the banks BNK and the cathodes CD to cover the banks BNK and the cathodes CD. Although the organic EL light emitting layer OLE is formed typically by a mask vapor deposition method, it is possible to use other methods, such as an ink jet method or patterning using a photolithography method after forming a thin film, depending on the material of the organic light emitting layer OLE. In the embodiment 1, by adopting a mask vapor deposition method, an electron transport layer (Alq), a first organic light emitting layer, a second organic light emitting layer, and a hole transport layer (α-NPD) are stacked sequentially. In forming the first organic light emitting layer, BH-120, a product of Idemitsu Kosan Co., Ltd., is used as a host material, and RD-001X, a product of Idemitsu Kosan Co., Ltd, is used as a dopant. In forming the second organic light emitting layer, BH-120, a product of Idemitsu Kosan Co., Ltd., is used as a host material, and BD-102, a product of Idemitsu Kosan Co., Ltd, is used as a dopant. The organic light emitting layer OLE(W) which is capable of emitting a white light, is obtained using both the first light emitting layer and the second light emitting layer.

An ITO film is formed to cover a front surface of the organic EL light emitting layer OLE(W), thus forming a transparent anode AD, which constitutes a second electrode. The transparent anode AD is not limited to an ITO film, and it may be formed of another transparent conductive film, such as a transparent metal film. Further, a protective layer PAS is formed over the transparent anode AD. The organic EL light emitting layer OLE(W), the transparent anode AD and the protective layer PAS define surface shapes (recessed portions) which trace the shapes of the banks BNK. The protective layer PAS is formed for protecting the organic EL light emitting layer OLE(W) and for controlling the wettability in forming the color filters using an ink jet method in a succeeding step. The protective layer PAS also prevents deterioration of the properties of the organic EL light emitting layer OLE(W) by the color filter material (ink) applied using the ink jet method.

Although silicon nitride (SiN) or silicon oxide (SiO) may be used as a material of the protective layer PAS, another insulation material having similar properties may be used as well. The protective layer PAS is formed using a plasma CVD. When it is necessary to ensure the wettability, an ultraviolet-ray (UV) irradiation is performed optionally. It is also possible to adopt a film forming method in which a metal alkoxide is formed into a film by spin coating and is baked thereafter. Here, depending on the process condition, the formation of the protective layer PAS may be omitted.

Further, by dropping color-filter-material ink INK into a recessed portion formed by the banks BNK above the protective layer PAS from a nozzle of the ink jet device, color filters FIL having three colors (R, G, B) are formed. In FIG. 1, the coating of only color filters of two colors is shown. Although it is desirable to form the color filters FIL having three colors simultaneously from the point of view of shortening the manufacturing steps, this is not a requisite. The banks BNK suppress the mixing of the color-filter-material inks INK dropped from the nozzle.

After the formation of the color filters FIL, the color filters FIL are covered with a sealing member, such as a glass plate, a resilient film or the like, having a light transmitting property, thus sealing the surrounding area of the color filters FIL so as to prevent deterioration of the operational properties attributed to invasion of moisture from the surrounding environment, whereby a stable display is realized.

Although the embodiment 1 adopts a top anode constitution in which the first electrode and the second electrode are respectively formed of the cathode CD and the transparent anode AD, by selecting the electrode material, the organic light emitting material, the process condition and the like, the embodiment 1 can adopt a top cathode constitution in which the first electrode is formed of the anode and the second electrode is formed of the cathode.

In the embodiment 1 explained heretofore, the color filters which form the respective pixels can be directly formed on the substrate on which the white-light organic light emitting layer is formed using the ink jet method, and, therefore, it is possible to provide an organic EL display device capable of high definition, which is free from displacement or shifting of the three colors.

Embodiment 2

Figure 2:
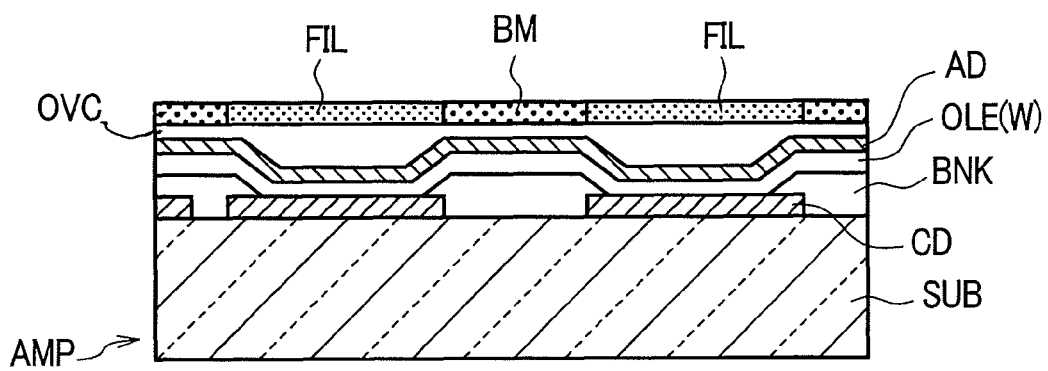
FIG. 2 is a cross-sectional view showing an embodiment 2 of the present invention.

FIG. 2 is a cross-sectional view showing an embodiment 2 of the present invention. The illustration of the color-filter-material ink INK indicated in FIG. 1 is omitted in FIG. 2 for purposes of simplification of the drawing. The TFT substrate AMP of the embodiment 2 is substantially the same as that of embodiment 1 until the step in which the cathodes CD, which constitute the first electrodes, the banks BNK, the organic light emitting layer OLE(W) and the transparent anode AD, which constitutes the second electrode, are formed in this order on the upper surface of the glass substrate SUB. In the embodiment 2, the organic material is applied to the upper surface of the transparent anode AD so as to form an interlayer film OVC which covers the transparent anode AD, whereby the undulation of an upper surface of the transparent anode AD (in other words, an irradiation surface of light from the organic light emitting layer OLE(W)) which is generated by the banks (BNK) or the like can be leveled. Accordingly, the surface of the transparent anode AD is eliminated. The interlayer film OVC is made of a material which belongs to a metal alkoxide group. The interlayer film OVC made of metal alkoxide is applied, with a film thickness (desirably 1 μm or more) equal to or more than a degree which can level the upper surface of the transparent anode AD, by spin coating, the UV irradiation is performed under a mixed atmosphere of ozone and nitrogen so as to enhance the oxidizing property, and the interlayer film OVC is cured at a low temperature (desirably, 100° C. or less).

Thereafter, a light blocking layer (black matrix) BM is formed between the pixels, that is, right above the banks BNK by screen printing using a mask. Further, the color-filter-material ink INK is dropped into the openings of the black matrix BM from the nozzle of the ink jet device so as to form the color filters FIL.

Here, the step in which the interlayer film OVC made of metal alkoxide is treated under a mixed atmosphere of ozone and nitrogen is an option which is adopted to shorten the treatment time, and, hence, the step is not a requisite.

After the formation of the color filters FIL, the color filters FIL are covered with a sealing member, such as a glass plate, a flexible film or the like, having light transmitting property, thus sealing the surrounding area of the color filters FIL so as to prevent deterioration of the operational properties attributed to invasion of moisture from the surrounding environment, whereby a stable display is realized.

According to the embodiment 2, in addition to the advantageous effects obtained by the embodiment 1, the flatness of the organic EL light emitting layer can be made uniform between the pixels, and, at the same time, a leaking of light from a neighboring pixel can be prevented by properly selecting the refractive index of the interlayer film OVC and the size of opening portions of the pixels formed by the black matrix BM, whereby it is possible to obtain an image display of high contrast and high color purity. Here, the embodiment 2 can also adopt a top cathode constitution in the same manner as the embodiment 1.

Embodiment 3

Figure 3:
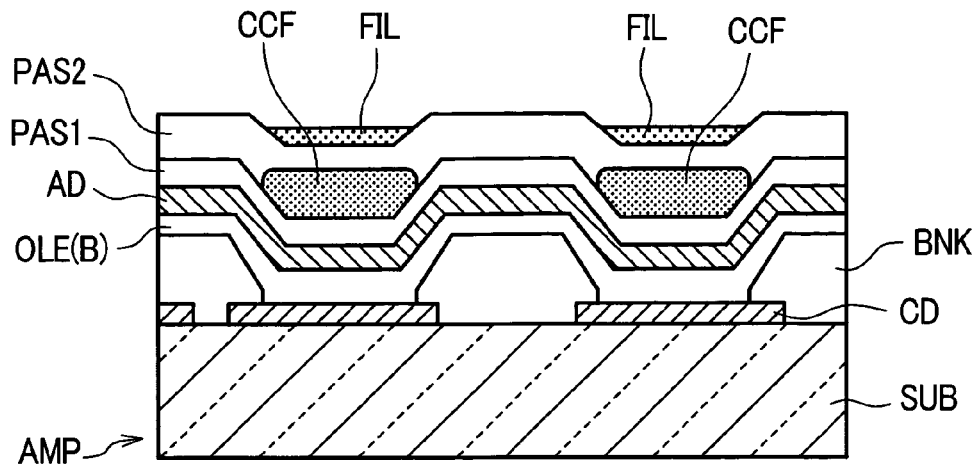
FIG. 3 is a cross-sectional view showing an embodiment 3 of the present invention.

FIG. 3 is a cross-sectional view showing an embodiment 3 of the present invention. In the embodiment 3, the illustration of the color-filter-material ink INK shown in FIG. 1 is omitted. The TFT substrate AMP of the embodiment 3 is substantially the same as the TFT substrate AMP of the embodiment 1 and the embodiment 2 up to the formation of the cathodes CD, which constitute the first electrodes, and the banks BNK formed on the main face of the glass substrate SUB. In the embodiment 3, in place of the organic light emitting layer OLE (W), which is capable of emitting white light in the embodiment 1 and the embodiment 2, an organic light emitting layer OLE (B), which emits blue light, is formed in a state such that the organic light emitting layer OLE (B) covers the banks BNK and the opening portions of the cathodes CD. Here, it is desirable that the height of the banks BNK in the embodiment 3 is set to be larger than the height of the banks BNK in the embodiment 1 and the embodiment 2.

Next, the anode AD, which constitutes the second electrode, is formed in a state such that the anode AD covers the whole surface of the organic light emitting layer OLE (B), and then a first protective layer PAS1 is formed above the anode AD. Above the first protective layer PAS1, ink material for forming wavelength converting filters (a color changing medium which converts the blue light into three respective colors) is dropped from the nozzle of the ink jet device into the recessed portions formed by the banks BNK, thus forming wavelength converting filters CCF of three colors (R, G, B). In FIG. 3, only the coating of the wavelength converting filters of two colors is shown.

Although it is desirable to simultaneously form all filter layers concerned the wavelength conversion into each color from the part of view of shortening the manufacturing steps, this is not a requisite.

The banks BNK suppress the mixing of the wavelength-converting-filter-material ink dropped from the nozzle. Here, the pixel for the color blue (B) may adopt a constitution in which the wavelength converting filter is not applied.

A second protective layer PAS2, which also functions as an interlayer film, is formed as a film in a state such that the second protective layer PAS2 covers the wavelength converting filter CCF. Although the second protective layer PAS2 is also made of silicon nitride (SiN) or silicon oxide (SiO) in the same manner as the first protective layer PAS1, the second protective layer PAS2 may be formed using other similar materials, such as an amorphous carbon film, for example, by a plasma CVD method or sputtering. The carbon film which is formed by the plasma CVD method constitutes a diamond-like hard film.

Next, color-filter-material ink is dropped into recessed portions of the second protective layer PAS2, which follow the surface shape of the banks BNK, from the nozzle of the ink jet device, thus forming color filters FIL of three colors (R, G, B). FIG. 3 shows only the coating of the color filters of two colors. In forming the color filters FIL, although it is desirable that all filter layers which allow the respective lights of three colors to transmit therethrough are formed simultaneously from the point of view of shortening the manufacturing steps, this is not a requisite. The banks BNK suppress the mixing of color-filter-material inks dropped from the nozzle. Here, the pixel for the color blue (B) may have a constitution in which the color filter is not applied.

After the formation of the color filters FIL, the upper surfaces of the color filters FIL are covered with a sealing member, such as a glass plate, a flexible film or the like, having a light transmitting property, thus sealing the surrounding area of the color filters FIL, so as to prevent deterioration of the operational properties attributed to the invasion of moisture from the surrounding environment, whereby a stable display is realized.

According to the embodiment 3, with the use of the organic light emitting layer OLE (B), which emits a blue light that exhibits a higher luminance and has a longer lifetime than the currently available organic light emitting layer OLE (W), which is capable of emitting the white light, it is possible to obtain an image display of high luminance and high contrast. Here, the embodiment 3 also can adopt a top cathode constitution in the same manner as the embodiment 1 and the embodiment 2.

Figure 4:
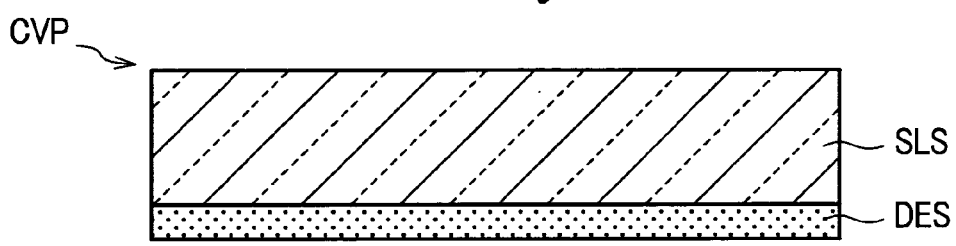
FIG. 4 is a diagrammatic cross-sectional view showing one example of a sealing member which seals a color filter forming surface of a TFT substrate AMP which constitutes an organic EL display device of the present invention.

FIG. 4 is a diagrammatic cross-sectional view showing one example of a sealing member which seals a color filter forming surface of the TFT substrate AMP, which constitutes the organic BL display device of the present invention. The sealing member CVP provides an absorbent (desiccant) layer DES on an inner surface of a glass plate SLS. By sealing the TFT substrate AMP on peripheries not shown in the drawing, the organic EL display device (panel) is completed.

Figure 5:
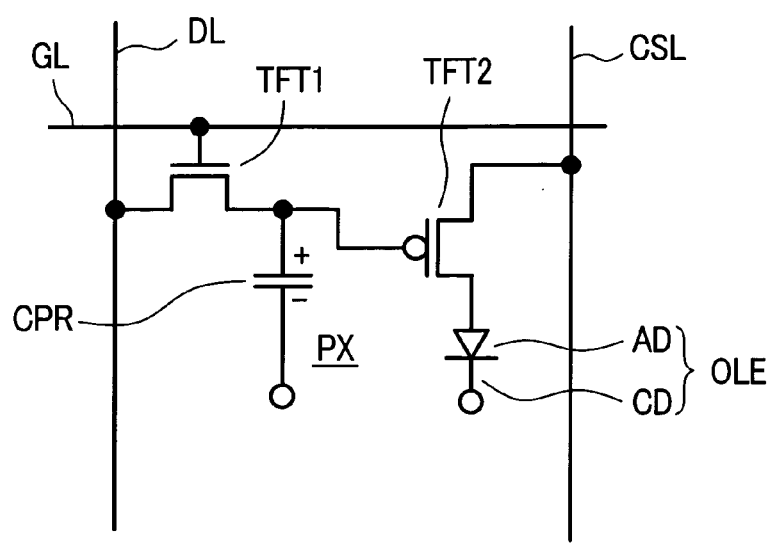
FIG. 5 is a circuit diagram showing an example of a pixel of the organic EL display device.

FIG. 5 is a schematic circuit diagram showing a constitutional example of a pixel of the organic EL display device. The pixel PX constitutes a sub pixel in the color display. The pixel PX is constituted of a thin film transistor TFT 1 for switching, which is connected to a scanning line GL and a data line DL, a storage capacitance CPR, which stores display data supplied from the data line DL as a charge when the thin film transistor TFT is selected by the scanning line GL, a thin film transistor TFT2 which drives an organic EL element OLE, and a current supply line CSL.

The thin film transistor TFT 1 has the gate electrode thereof connected to the scanning line GL and the drain electrode thereof connected to the data line DL. Further, the gate electrode of the thin film transistor TFT 2 is connected to the source electrode of the thin film transistor TFT 1, and one electrode (+pole) of the storage capacitance CPR is connected to this node. The thin film transistor TFT 2 has the drain electrode thereof connected to the current supply line CSL and the source electrode thereof connected to the anode AD of the organic EL element OLE.

When the pixel PX is selected by the scanning line GL and the thin film transistor TFT 1 is turned on, the display data supplied from the data line DL is stored in the storage capacitance CPR. Further, at a point of time when the thin film transistor TFT1 is turned off, the thin film transistor TFT2 is turned on and an electric current flows from the current supply line CSL to the organic EL element OLE, and the current is held for a period of substantially 1 frame (or 1 field). The electric current which flows here is defined by a charge corresponding to the data signal stored in the storage capacitance CPR. The circuit shown in FIG. 5 has the simplest constitution, and other various circuit constitutions can be used.

Figure 6:
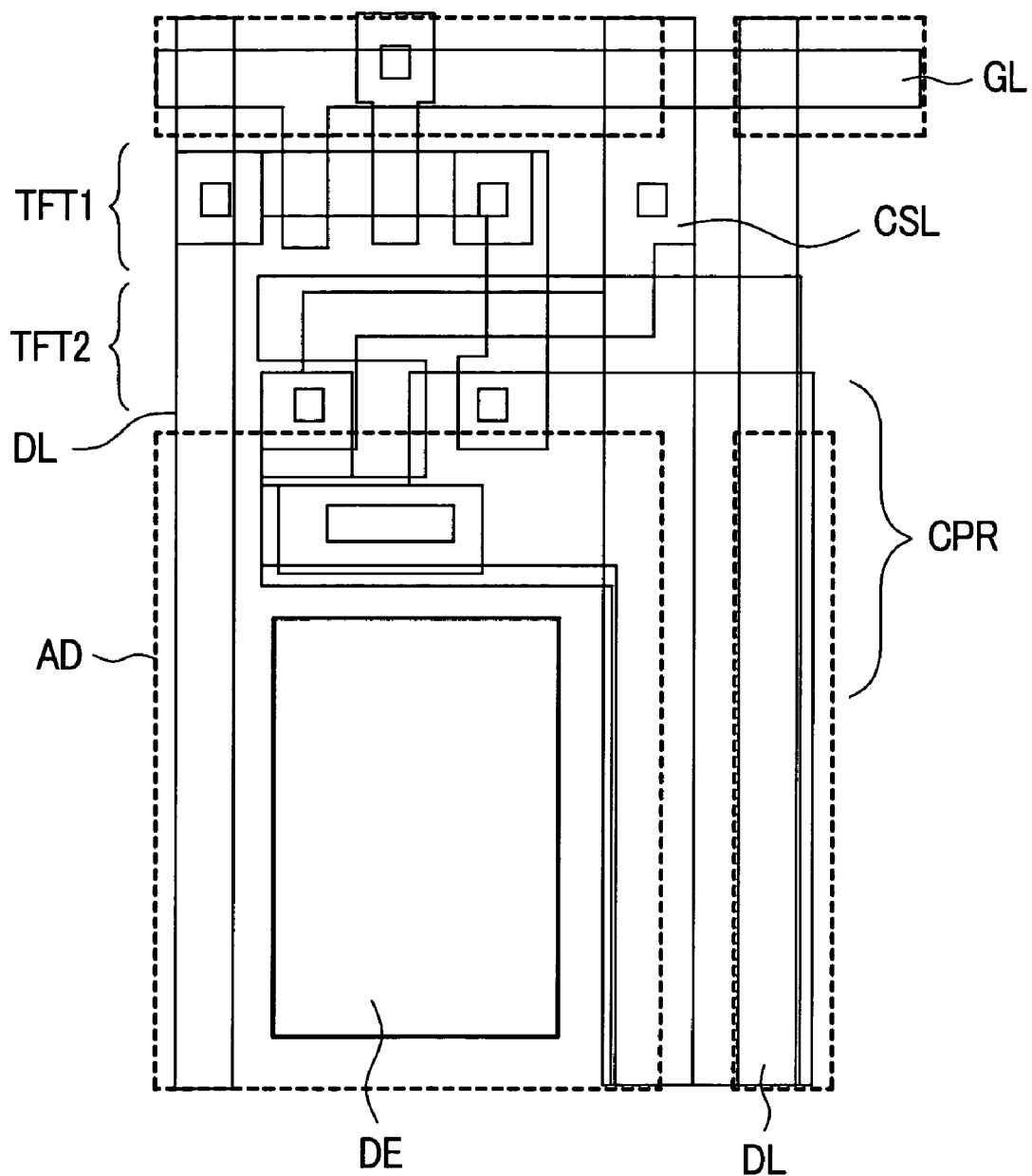
FIG. 6 is a plan view of the vicinity of the pixel showing a constitutional example in which a circuit of the pixel shown in FIG. 5 is realized on a substrate.

FIG. 6 is a plan view of the vicinity of a pixel showing a structural example of the circuit of the pixel shown in FIG. 5 on a substrate. In the drawing, the same symbols used in FIG. 5 correspond to identical portions, wherein symbol DE indicates the opening portion of the pixel. The thin film transistor TFT 1 and the thin film transistor TFT 2 are arranged on a non-display portion, which is arranged close to the opening portion DE of the pixel.

Figure 7:
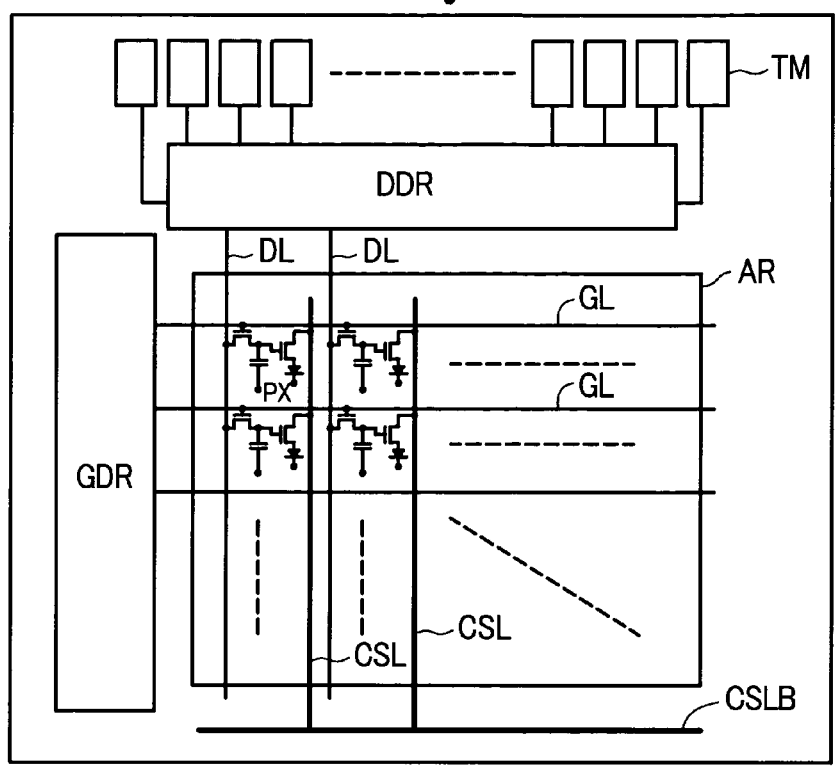
FIG. 7 is an equivalent circuit diagram including a drive circuit of the organic EL display device.

FIG. 7 is an equivalent circuit diagram including a drive circuit of the organic EL display device. The pixels PX are arranged in a matrix array to form a display region AR. The data lines DL are driven by a data line drive circuit DDR. Further, the scanning lines GL are driven by a scanning line drive circuit GDR. The current supply line CSL is connected to a current supply circuit (not shown in the drawing) through a current supply bus line CSLB. Here, symbol TM indicates external input terminals.

Figure 8:
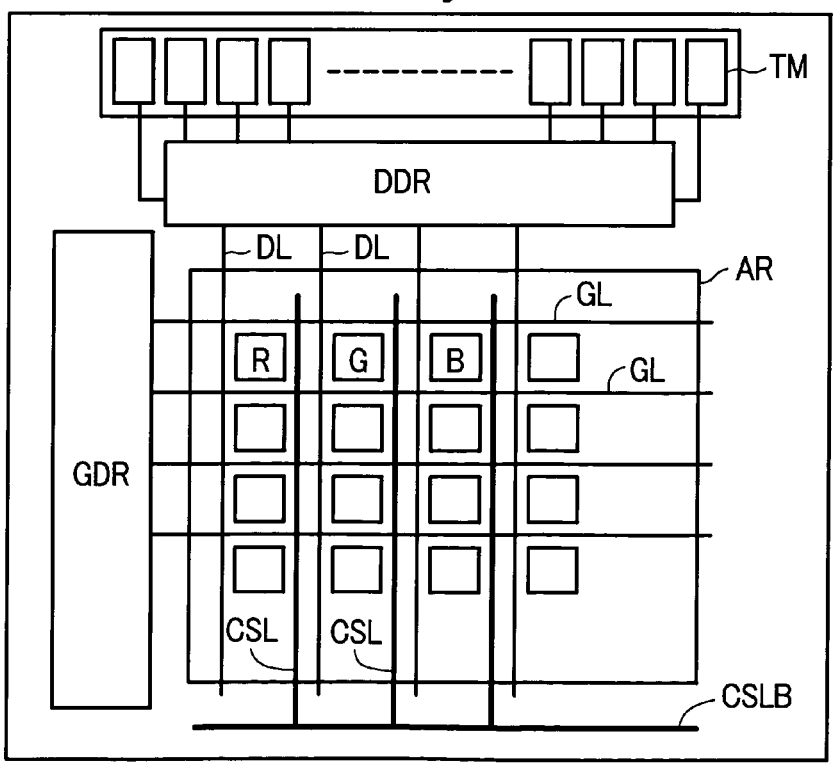
FIG. 8 is an equivalent circuit diagram showing the constitution of a full-color-display organic EL display device.

FIG. 8 is an equivalent circuit diagram which shows the constitution of an organic EL display device that is capable of producing a full color display. The respective display portions R, G, B of three colors are constituted of pixels (sub pixels) PX shown in FIG. 7, and they are arranged in the direction of the scanning line GL to form one color pixel (constituted of the respective sub pixels PX of R, G, B). Other constitutions of this equivalent circuit are substantially the same as the corresponding constitutions shown in FIG. 7.

The advantageous effect, in which the mixing of colors to the neighboring pixel can be prevented by realizing a coating of the materials of different color filters or the different wavelength converting filters with high accuracy using an ink jet device, is not limited to an organic EL display device. That is, it is possible to obtain substantially the same advantageous effect by applying such a technical concept to other display devices, for example, a display device which uses plasma elements.

What is claimed is:

1. An organic EL display device comprising an active matrix portion in which a plurality of organic EL light emitting elements are arranged in the inside of a main face of a substrate, and a sealing portion which seals the active matrix portion, wherein, each organic EL light emitting element includes one of a plurality of first electrodes which are formed above the main face of the substrate, an organic EL layer which is formed in a state that the organic EL layer covers the plurality of first electrodes in common, and a second electrode which is formed above the organic EL layer in a state that the second electrode is formed in common with the plurality of organic EL light emitting elements, and light emitted from the organic EL layer is irradiated to the second electrode side, and wherein the active matrix portion further comprises:

wavelength converting filters which convert a wavelength of light emitted from the organic EL layer to a given wavelength and which are formed above the second electrode for every organic EL light emitting element by coating in a wet process, a color filter, which selectively allows light of the given wavelength to pass, wherein said color filter is formed above at least one of the wavelength converting filters to receive light from the at least one of the wavelength converting filters, which received light corresponds to the light emitted from the organic EL layer which has been shifted by the at least one of the wavelength converting filters to the given wavelength for every organic EL light emitting element by coating in a wet process, a first protective layer which suppresses the deterioration of the organic EL layer attributed to a coating material of the wavelength converting filter and which is provided between the second electrode and the wavelength converting filter, and a second protective layer which suppresses the deterioration of the organic EL layer attributed to a coating material of the color filter and which is provided between the wavelength converting filter and the color filter, wherein the active matrix portion of the substrate is sealed by the sealing portion, and wherein said color filter is directly formed on said second protective layer of said substrate.

2. An organic EL display device according to claim 1, wherein each one of the plurality of first electrodes is separated from another of the plurality of first electrodes, which is arranged close to said one first electrode, by partition banks which surround a periphery of said one first electrode and which have a film thickness larger than a film thickness of said one first electrode, and wherein the organic EL layer which is brought into contact with an upper surface of the one first electrode is formed in the inside of a recessed portion which is formed in the partition banks and which exposes said one first electrode.

3. An organic EL display device according to claim 2, wherein the wavelength converting filter is formed in the recessed portion formed by the partition banks and above the organic EL layer.

4. An organic EL display device according to claim 2, wherein the color filter is formed in the recessed portion formed by the partition banks and above each wavelength converting filter corresponding to each organic EL layer.

5. An organic EL display device according to claim 1, wherein the wet process is performed using an ink jet method.

6. An organic EL display device according to claim 1, wherein the sealing portion of the organic EL display device includes a sealing member which seals a surface on which the color filter is formed.

7. An organic EL display device according to claim 6, wherein an absorbent is provided in the inside which is sealed by the sealing member.

8. An organic EL display device according to claim 1, wherein said organic EL layer emits blue light.

9. An organic EL display device according to claim 2, wherein said organic EL layer emits blue light.

10. An organic EL display device according to claim 3, wherein said organic EL layer emits blue light.

11. An organic EL display device according to claim 4, wherein said organic EL layer emits blue light.

12. An organic EL display device according to claim 5, wherein said organic EL layer emits blue light.

13. An organic EL display device according to claim 6, wherein said organic EL layer emits blue light.

14. An organic EL display device according to claim 7, wherein said organic EL layer emits blue light.

15. An organic EL display device according to claim 1, wherein the wavelength converting filters are separated from the color filter.

16. The organic EL display device according to claim 15, wherein a passivation layer is inserted between the wavelength converting filters and the color filter.

* * * * *